(12) United States Patent
Nagaraj et al.

(10) Patent No.: US 8,427,205 B1
(45) Date of Patent: Apr. 23, 2013

(54) METHOD AND APPARATUS FOR FAST FREQUENCY LOCKING IN A CLOSED LOOP BASED FREQUENCY SYNTHESIZER

(75) Inventors: Geetha B. Nagaraj, Coral Springs, FL (US); Nicholas G. Cafaro, Coconut Creek, FL (US); Robert E. Stengel, Pompano Beach, FL (US); Sumit A. Talwalkar, Plantation, FL (US)

(73) Assignee: Motorola Solutions, Inc., Schaumburg, IL (US)

( * ) Notice: Subject to any disclaimer, the term of this patent is extended or adjusted under 35 U.S.C. 154(b) by 0 days.

(21) Appl. No.: 13/328,240

(22) Filed: Dec. 16, 2011

(51) Int. Cl.
*H03B 21/00* (2006.01)
*H03L 7/00* (2006.01)

(52) U.S. Cl.
USPC ............................ 327/105; 327/141; 327/162

(58) Field of Classification Search .................. 327/291, 327/293, 261, 271, 277, 284, 285, 105–107, 327/141, 162
See application file for complete search history.

(56) References Cited

U.S. PATENT DOCUMENTS

| | | | |
|---|---|---|---|
| 6,359,480 B1 * | 3/2002 | Isobe et al. | 327/141 |
| 6,909,329 B2 | 6/2005 | Jasa et al. | |
| 7,068,081 B2 * | 6/2006 | Naffziger et al. | 327/105 |
| 7,636,019 B1 | 12/2009 | Lombaard et al. | |
| 7,825,702 B2 * | 11/2010 | Shiobara | 327/105 |
| 7,888,973 B1 * | 2/2011 | Rezzi et al. | 327/105 |
| 2006/0208809 A1 | 9/2006 | Erdogan | |
| 2009/0137211 A1 | 5/2009 | Stengel et al. | |

OTHER PUBLICATIONS

Soh Lip-Kai et al—"Fast-Lock Dual Charge Pump Analog DLL using Improved Phase Frequency Detector"—IEEE—2007.

* cited by examiner

*Primary Examiner* — Hai L Nguyen
(74) *Attorney, Agent, or Firm* — Barbara R. Doutre

(57) ABSTRACT

A synthesizer comprises a first processing unit that receives digital information relating to a required final frequency of the synthesizer and determines a primary frequency value and a corresponding frequency multiplier mode. A primary synthesizer receives the primary frequency value and an external reference frequency signal to generate a signal of the primary frequency. The synthesizer further comprises a second processing unit that receives the primary frequency value, determines a pre-charge voltage value corresponding to the primary frequency value, and transmits the pre-charge voltage value to a delay locked loop in response to a change in the primary frequency value. The delay locked loop receives the signal of primary frequency and the pre-charge value. The DLL is pre-charged to the pre-charge voltage value for a predetermined time, by opening and closing the delay locked loop to obtain fast locking of the synthesizer.

20 Claims, 13 Drawing Sheets

| MODE OF OPERATION | PRIMARY FREQUENCY RANGE | FINAL FREQUENCY RANGE | TUNING RANGE OF DLL |
|---|---|---|---|
| 1X | 500M-1G | 500M-1G | VLOW-VHIGH |
| 2X | 500M-1G | 1G-2G | VLOW-VHIGH |
| 4X | 500M-1G | 2G-4G | VLOW-VHIGH |

*FIG. 9*

METHOD AND APPARATUS FOR FAST FREQUENCY LOCKING IN A CLOSED LOOP BASED FREQUENCY SYNTHESIZER

FIELD OF THE DISCLOSURE

The present disclosure relates generally to a closed loop based frequency multiplier and quadrature generator in a communication system and more particularly to a method for fast frequency locking in the closed loop based frequency multiplier and quadrature generator operating in the communication system.

BACKGROUND

A wide range fast settling frequency synthesizer is one of the core blocks in a radio frequency integrated circuit (RFIC). A closed loop based architecture such as a delay locked loop (DLL) based block extends the frequency range of a primary synthesizer while providing the functionality of a quadrature generator. The input signal that is provided to the DLL based frequency multiplier is received from either a direct digital synthesizer (DDS) or a conventional phase lock loop (PLL) based primary synthesizer. The input signal to the frequency multiplier is a programmable frequency signal that can be constantly changing. As this signal with constantly changing frequency is provided to the DLL based frequency multiplier, the internal delay locked loop (DLL) in the DLL based frequency multiplier is forced to lock each time to the changed input signal. In scenarios such as fast spectral sensing or direct digital modulation, the input signal can vary rapidly over a wide frequency range. In such scenarios, for every change in the input signal, the time taken by the internal DLL to settle down becomes significantly longer. This long settling time of the internal DLL limits the performance of the DLL based frequency multiplier when used in applications like fast spectral sensing or direct digital modulation. The longer settling time of the internal DLL can also distort an in-phase (I) and a quadrature phase (Q) components of an output signal.

Thus, there is a need for a solution that reduces the settling time of the internal DLL to enable fast switching of the DLL based frequency multiplier over a wide frequency range.

BRIEF DESCRIPTION OF THE FIGURES

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

FIG. 9 is a table showing the tuning range of the delay locked loop and the range of final frequencies at various modes of operation in accordance with some embodiments of the present invention.

In FIGS. 2-7, the bold lines show digital information, the regular lines show analog signals, and the dashed lines show signals that may be either digital or analog. Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

Figure 1:
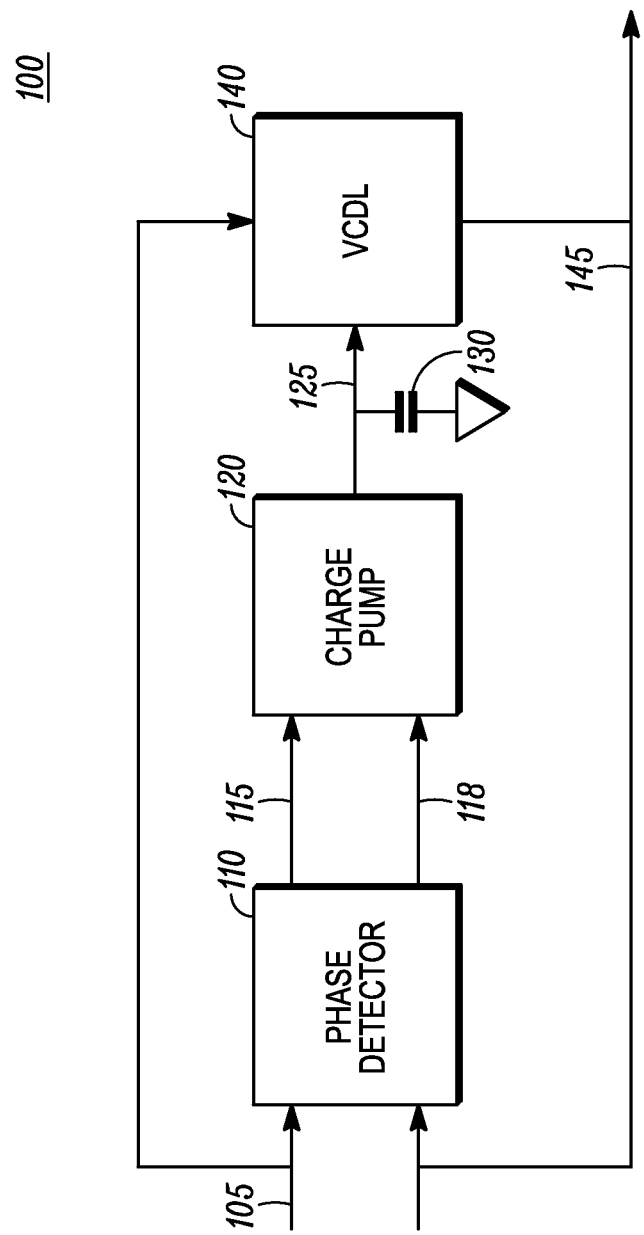
FIG. 1 is a block diagram of a conventional delay locked loop in accordance with the prior art.

The method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION

A wide range frequency synthesizer comprises a first processing unit that receives digital information relating to a required final frequency of the synthesizer. The first processing unit determines a primary frequency value and a corresponding frequency multiplier mode. The synthesizer further comprises a primary synthesizer that receives the primary frequency value and an external reference frequency signal and generates a signal of the primary frequency. The synthesizer further comprises a second processing unit that receives the primary frequency value, determines a pre-charge voltage value corresponding to the primary frequency value, and transmits the pre-charge voltage value to a delay locked loop. The delay locked loop receives the primary frequency signal and the pre-charge value, and pre-charges the delay locked loop to the pre-charge voltage value for a predetermined time by opening and closing the delay locked loop to obtain fast locking of the synthesizer.

FIG. 1 is a block diagram of a conventional delay locked loop (DLL) 100 in accordance with the prior art. The DLL 100 includes a phase detector 110, a charge pump 120, a loop filter 130, and a voltage controlled delay line (VCDL) 140. The DLL 100 is a closed loop the compares a reference signal 105 with an output 145 of the VCDL 140 to synchronize the output 145 with the reference signal 105 using a feedback mechanism. The reference signal 105 and the output 145 of the VCDL 140 are provided to the phase detector 110 as inputs. The phase detector 110 compares the reference signal 105 with the output 145 of the VCDL 140 and determines whether the reference signal 105 is leading or lagging the output 145. The phase detector 110 produces an up signal 115 when the reference signal 105 is leading the output 145 of the VCDL 140. Similarly, the phase detector 110 produces a down signal 118 when the reference signal 105 is lagging the output 145 of the VCDL 140.

The output (i.e. either the up signal 115 or the down signal 118) from the phase detector 110 is provided to the charge pump 120. The charge pump 120 is used to charge the loop filter 130 based upon the output (i.e. either the up signal 115 or the down signal 118) of the phase detector 110. In particular, the up signal 115 received by the charge pump 120 is used to charge the loop filter 130, and the down signal 118 is used to discharge the loop filter 130. The charging or discharging of the loop filter 130 further controls the voltage across the input signal 125 provided to the VCDL 140. The VCDL 140 includes multiple buffers (not shown) and the input signal 125 adjusts the delay of each of the multiple buffers and hence produces the output signal 145 having phase similar to that of the reference signal 105. The process of producing the output signal 145 having same phase as that of the reference signal 105 is a continuous iterative process, and the delay locked loop 100 is said to be locked when the phase of the output signal 145 matches that of the reference signal 105. In accordance with various embodiments to be described herein a processing unit (shown in FIG. 2) and the VCDL 140 will operate to pre-charge the delay lock loop and minimize settling time. The pre-charging is based on the frequency of the reference signal 105.

Figure 2:
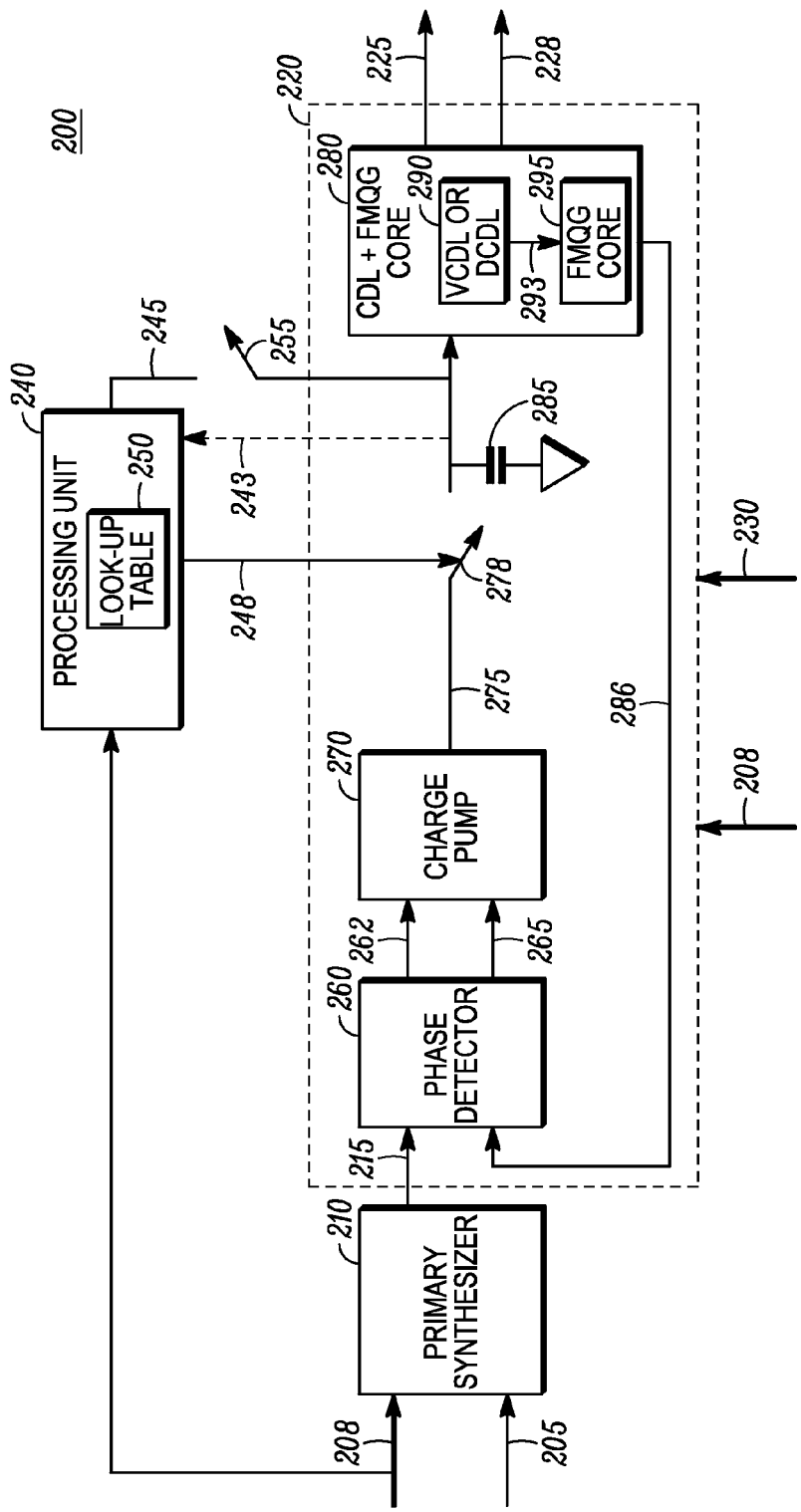
FIG. 2 shows a block diagram of a frequency synthesizer with a primary synthesizer and a delay locked loop based frequency multiplier and quadrature generator in accordance with some embodiments of the present invention.

FIG. 2 shows a block diagram of a frequency synthesizer with a primary synthesizer and a delay locked loop based frequency multiplier and quadrature generator in accordance with some embodiments of the present invention. The frequency synthesizer 200 can be a fast locking wide range frequency synthesizer comprising a primary synthesizer 210 and in accordance with the various embodiments, a delay locked loop (DLL) based frequency multiplier and quadrature generator (FMQG) 220 and a processing unit 240. The DLL based FMQG 220 includes a phase detector 260, a charge pump 270, and a controlled delay line (CDL) with frequency multiplier and quadrature generator (FMQG) core 280. The primary synthesizer 210 is an electronic device that is capable of producing signals of different frequencies. The primary synthesizer 210 can be a conventional phased lock loop (PLL) or a direct digital synthesizer (DDS). The primary synthesizer 210 receives an external reference frequency signal 205 and a digital information signal 208 relating to a required primary frequency value. In accordance with some embodiments, the digital information signal 208 indicates a frequency signal that should be generated and provided to the DLL based FMQG 220 in order for the DLL based FMQG 220 to generate a required output signal. The primary synthesizer 210 upon receiving the external reference frequency signal 205 and the digital information signal 208 relating to the required primary frequency value, produces a signal 215 of primary frequency value.

The output signal 215 from the primary synthesizer 210 is further provided to a phase detector 260 of the DLL based FMQG 220 as an input. The DLL based FMQG 220 also receives a digital information regarding a frequency multiplier mode 230 in which the DLL based FMQG 220 should operate in order to generate the required outputs, an in-phase signal 225 and a quadrature-phase signal 228. In accordance with some embodiments of the present invention, the DLL based frequency multiplier and quadrature generator 220 receives the digital information regarding the frequency multiplier mode 230 on which a frequency multiplier quadrature generator core 295 in the frequency synthesizer 200 should operate from a frequency multiplier mode selector unit (shown in FIG. 3). The digital information regarding the frequency multiplier mode 230 is prior known information stored in the frequency multiplier mode selector unit. Monitoring of the digital information signal 208 relating to the required primary frequency value enables the processing unit 240 to achieve fast frequency locking in the DLL based frequency multiplier and quadrature generator 220 as explained below.

The DLL based frequency multiplier and quadrature generator 220 also receives a signal 248 to open or close a switch 278 to open or close the loop from the processing unit 240. The processing unit 240, during a training mode, varies the primary input frequency of the signal 215 fed to a phase detector 260 of the DLL based frequency multiplier and quadrature generator 220 and measures the voltage across a loop filter 285 at the CDL with FMQG core 280 input in the DLL based FMQG 220. The measured voltage value across the loop filter 285 is provided to the processing unit 240 as a signal 243. The processing unit then stores the measured voltage values 243 corresponding to the primary frequency values 208 of the DLL input signals 215 in a look-up table 250. During normal mode, the processing unit 240 monitors the frequency value 208 of the input signal provided to the DLL based FMQG 220 and determines a required voltage value across the loop filter 285 in order to get the required final frequency signal from the look-up table 250. If a change is detected in the value of the primary frequency value 208, the processing unit 240 upon determining the required voltage value across the loop filter 285 from the look-up table 250, sends an open signal 248 to open the loop of the DLL based FMQG 220. The processing unit then sends a signal 245 to the DLL based FMQG 220 to pre-charge the loop filter 285 to the required voltage value by closing the switch 255 for a predetermined amount of time. In accordance with some embodiments of the present invention, the pre-charging of the loop filter 285 refers to charging or discharging of the loop filter 285 to the required voltage value by the processing unit 240. The processing unit upon pre-charging the loop filter 285 opens the switch 255 and sends the signal 248 to the DLL based FMQG 220 to close the loop. The pre-charging of the loop filter 285 enables fast frequency settling in the FMQG core 295.

In accordance with some embodiments of the present invention, the look-up table 250 can be customized to store the pre-charge voltage values corresponding to the required final frequency for only certain primary frequencies within the range of the CDL 290, and this result can be either extrapolated or interpolated to work over its entire frequency range during normal mode. The stored pre-charge voltage values can also be updated if necessary during normal mode to capture any changes in the operating conditions, such as temperature. This methodology can be used in any closed loop control system such as PLL, DLLs or others which can be trained and where there is a priori information that is available which can be used to guide the system to converge faster by using the initialization routine.

Figure 3:
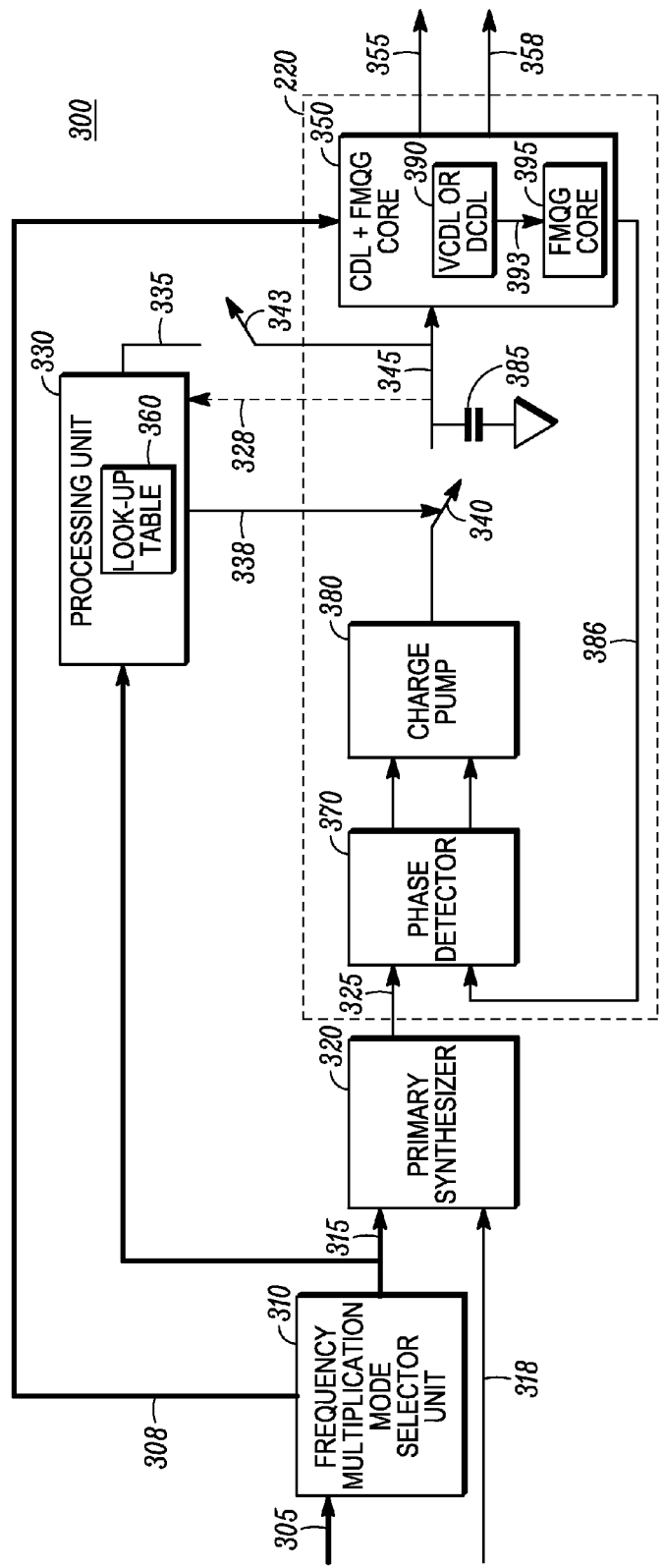
FIG. 3 shows a detailed diagram of the frequency synthesizer with a primary synthesizer and a delay locked loop based frequency multiplier and quadrature generator shown in FIG. 2 in accordance with some embodiments of the present invention.

FIG. 3 shows a detailed diagram of a frequency synthesizer 300 with a primary synthesizer and a delay locked loop based frequency multiplier and quadrature generator in accordance with various embodiments of the present invention. The frequency synthesizer 300 can be a fast locking wide range frequency synthesizer comprising a frequency multiplication mode selector unit 310, a primary synthesizer 320, a processing unit 330, and a delay locked loop (DLL) with a frequency multiplier and quadrature generator unit 220. The processing unit 330 provides digital training control to determine voltage value across a loop filter 385 in the DLL with FMQG 220 corresponding to primary frequency values 315 of the input signal 325 provided to a phase detector 370 of the DLL with FMQG 220 during a training mode. Further during a normal mode, the processing unit 330 provides the control 338 to open/close the loop and pre-charge the loop filter 385 in the DLL with FMQG 220. In accordance with some embodiments of the present invention, the processing unit 330 receives the voltage values corresponding to the frequency of the input signal 325 provided to the phase detector 370 of the DLL with FMQG 220 in signal 328 during the training mode and stores the measured voltage value in a look-up table 360. During the normal mode, the processing unit 330 monitors the primary frequency value 315. When the primary frequency value 315 changes, the processing unit 330 determines a required voltage value based upon the required primary frequency value 315 and sends a signal 338 to open a switch 340 to open the loop. The processing unit 330 then closes the switch 343 and sends a signal 335 to pre-charge the loop filter 385. The processing unit upon pre-charging the loop filter 385 opens the switch 343 and sends the signal 338 to close the loop.

The frequency multiplier mode selector unit 310 receives digital information signal 305 relating to a required final frequency at the output 355 and 358 of a frequency multiplier and quadrature generator (FMQG) core 395 in the CDL with FMQG core 350. The frequency multiplier mode selector unit 310 processes the digital information 305 relating to the required final frequency and determines a digital information relating to a primary frequency value 315 and a frequency multiplier mode selection information 308 for the DLL based FMQG 220. In accordance with some embodiments of the present invention, the digital information relating to the primary frequency value 315 indicates frequency of a signal 325 that should be generated and provided to the DLL based FMQG 220 in order to generate the required output signal at the output of the FMQG core 395 of the frequency synthesizer 300. Similarly, the digital information relating to the frequency multiplier mode selection 308 indicates the frequency multiplication mode in which the frequency multiplier and quadrature generator core 395 should be operated in order to generate output signal of the required final frequency. The frequency synthesizer 300 is operated in one of multiple frequency multiplication modes in order to achieve a wide range of frequencies. In accordance with the various embodiments of the present invention, the FMQG core 395 is operated in frequency multiplication modes 1×, 2×, and 4× to achieve an overall final frequency range of 500 MHz to 4 GHz while the primary synthesizer output is maintained between 500 MHz to 1 GHz.

The primary frequency value 315 is provided to the primary synthesizer 320 as an input. The primary synthesizer 320 also receives an input signal 318 (sinusoidal or square wave) of an external reference frequency. As already discussed, the primary synthesizer 320 can be a conventional phase locked loop (PLL) or a direct digital synthesizer (DDL). The primary synthesizer 320 upon receiving the input signal 318 of the external reference frequency and the primary frequency value 315 produces a signal 325 of the primary frequency value.

The primary frequency value 315 from the frequency multiplier mode selector unit 310 is also provided to the processing unit 330. The processing unit 330 includes the look-up table 360 that is used to determine a pre-charge voltage value for the loop filter 385 to enable fast locking of the DLL based FMQG 220. The processing unit 330 upon detecting a change in the primary frequency value 315, determines the pre-charge voltage that should be applied to the loop filter 385 in order to enable fast locking of the DLL based FMQG 220. In accordance with some embodiments of the present invention, the look-up table 360 in the processing unit 330 is prepared during the training mode.

A voltage controlled delay line (VCDL) or digitally controlled delay line (DCDL) unit 390 generates multiple copies 393 of the signal 325 of the primary frequency of various phases. Every time the primary frequency value 315 changes the conventional delay locked loop can take significant time to lock to the new primary frequency value and to generate multiple copies 393 of the signal 325. However, in accordance with the embodiments of the present invention, the loop in the DLL based FMQG 220 will settle down faster due to pre-charging of the loop filter 385 by a digital controller inside the processing unit 330. Whenever the primary frequency value 315 changes, the processing unit 330 sends the signal 338 to open the loop and charges the loop filter 385 with a pre-charge voltage corresponding to the new primary frequency value by sending the signal 335. The pre-charging of the loop filter enables the loop to quickly generates the output 393 having frequency similar to the new primary frequency value. After charging of the loop filter 385, the processing unit 330 sends the close loop signal 338 to close the loop. After closing the loop, the loop functions as normal loop to do the locking operation for better fine tuning and noise performance. The locking operation that is performed in the loop is achieved faster due to smaller difference between the input signal 325 and the output signals 393 of the loop.

The output signals 393 from the VCDL or DCDL 390 are further provided to the FMQG core 395 as inputs. The FMQG core 395 also receives the digital information regarding the frequency multiplication mode selection 308 from the frequency multiplication mode selector unit 310. In accordance with some embodiments of the present invention, the frequency multiplication mode in which the FMQG core 395 should operate can be one of 1×, 2×, or 4×. The FMQG core 395 upon receiving the multiple copies 393 of the signal 325 generates an in-phase (I) signal 355 signal and a quadrature-phase (Q) 358 signal of the required final frequency value 305.

Figure 4:
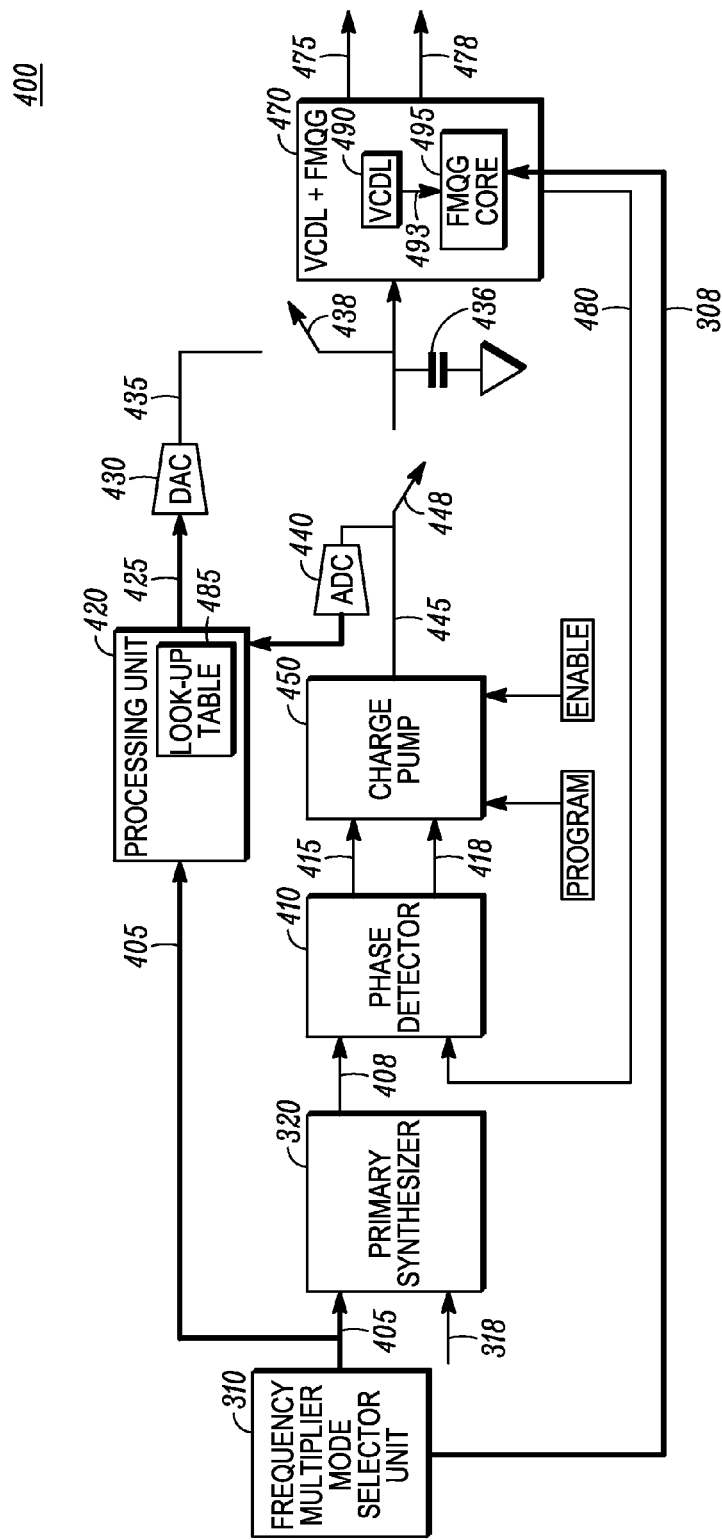
FIG. 4 shows a block diagram of a frequency synthesizer with a primary synthesizer and a delay locked loop based frequency multiplier and quadrature generator in accordance with some embodiments of the present invention.

FIG. 4 shows a block diagram of a frequency synthesizer 400 with a primary synthesizer and a delay locked loop based frequency multiplier and quadrature generator in accordance with some embodiments of the present invention. The frequency synthesizer 400 can be a fast locking wide range frequency synthesizer comprising a primary synthesizer 320, the frequency multiplication mode selector unit 310, a phase detector 410, a processing unit 420, a digital to analog converter (DAC) 430, a charge pump 450, an analog to digital converter (ADC) 440, a first switch 448, a loop filter 436, a second switch 438, and a voltage controlled delay line (VCDL) with frequency multiplier and quadrature generator (FMQG) 470. The VCDL with FMQG 470 includes a voltage controlled delay line (VCDL) 490 and a frequency multiplier and quadrature generator (FMQG) core 495. The processing unit 420 of FIG. 4 receives a digital information 405 relating to a required primary frequency value of the signal 408 from the primary synthesizer 320 and also of signals 493 from the VCDL 490 to the FMQG core 495 from the frequency multiplier mode selector unit 310. In accordance with some embodiments of the present invention, the FMQG core 495 also receives the digital information signal 308 relating to the mode in which the FMQG core 495 should operate in order to generate the required final output signal from the frequency multiplier mode selector unit 310. The digital information signal 405 relating to the required primary frequency value and frequency multiplication mode of the FMQG core 495 is prior known information. In accordance with some embodiments of the present invention, the digital information relating to the frequency multiplication mode of the FMQG core 495 is determined by the frequency multiplier mode selector unit 310.

The processing unit 420 of the frequency synthesizer 400 includes a look-up table 485 controlled by the processing unit 420 that is used to determine a pre-charge voltage value for the loop filter 436. During the training mode, the primary frequency value of the input signal 408 of the phase detector 410 is varied according to various primary frequency values 405 while keeping the loop closed by closing switch 448 and opening switch 438 and the voltage value across the input 445 of the VCDL with FMQG 470 is measured at various primary frequency values of the input signal 408. This information regarding the voltage value across the input 445 of the VCDL with FMQG 470 with respect to the various primary frequency values 405 is analog in nature and is then converted from analog form to digital form using ADC 440 and then stored in the look-up table 485.

In accordance with some embodiments of the present invention, during the normal mode of operation when the processing unit 420 detects a change in the primary frequency value 405, the processing unit 420 sends a signal to open the first switch 448 and close the second switch 438. In accordance with some embodiments of the present invention, the first switch 448 is closed and the second switch 438 is open during the normal mode of operation. The opening of the first switch 448 opens the loop in the DLL. The processing unit 420 upon opening the first switch 448 and closing the switch 438, determines the pre-charge voltage value that should be applied to the loop filter 436 for the new primary frequency value 405. The processing unit 420 determines the pre-charge voltage value using the look-up table 485 that stores the pre-charge values corresponding to various primary frequency values 405. The processing unit 420 upon charging the loop filter 436 with the pre-charge voltage value, sends a signal to open the second switch 438 and to close the first switch 448. The charging of the loop filter 436 with the determined pre-charge value changes the voltage of the input signal 445 provided to the VCDL 490. The output 493 from the VCDL 490 is then provided to the FMQG core 495, the FMQG core 495 thus generates the output signals 475 and 478 having similar frequency as that of the required final output frequency value 305.

The phase detector 410 receives a primary frequency signal 408 and output 480 of the VCDL 490 as inputs. In accordance with some embodiments of the present invention, the output from the VCDL 490 will now be generating frequency similar to that of the reference signal 408. The phase detector 410 compares the reference signal 408 with the output signal 480 from the VCDL 490. Based upon whether the reference signal 408 is leading or lagging the output from the VCDL 490, the phase detector sends either an up signal 415 or a down signal 418 to the charge pump 450 for charging or discharging the loop filter 436 respectively. In particular, the charge pump 450 upon receiving the up signal 415 sends a charge signal to charge the loop filter 436. Similarly, if the signal received by the charge pump 450 is a down signal 418, the charge pump sends a discharge signal to discharge the loop filter 436. This varies the voltage value of the input signal 445 provided to the VCDL 490. The difference between the reference signal 408 and the output 480 of the VCDL 490 is very small or almost negligible because of the pre-charging of the loop filter 436 by the processing unit 420. Therefore, the time taken by the loop to settle down in this case is minimized. Thus, the loop will settle down faster in such cases thereby reducing the time taken by the FMQG core 495 to generate the outputs 475 and 478.

Figure 5:
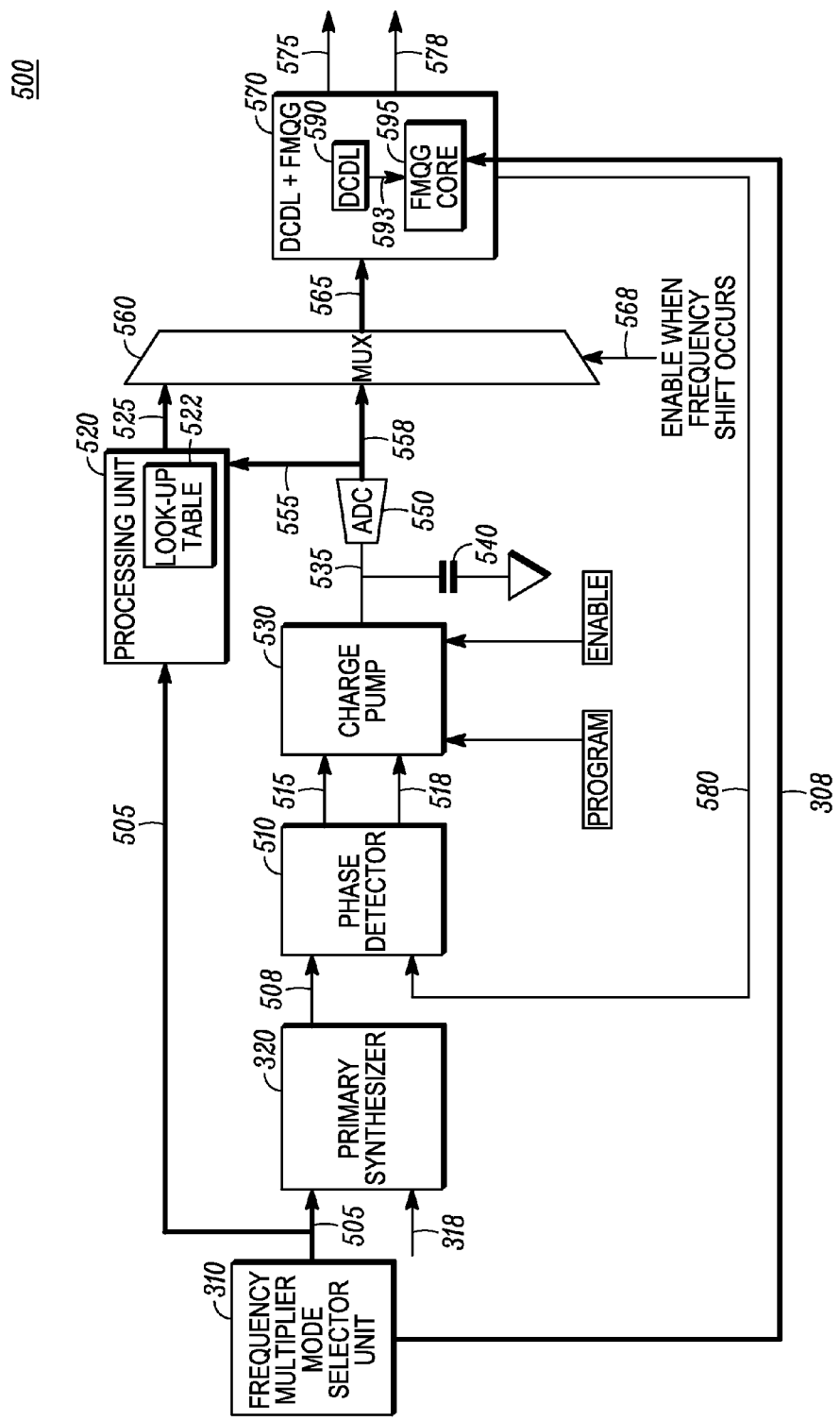
FIG. 5 shows a block diagram of a frequency synthesizer with a primary synthesizer and a delay locked loop based frequency multiplier and quadrature generator in accordance with some embodiments of the present invention.

FIG. 5 shows a block diagram of a frequency synthesizer 500 with a primary synthesizer and a delay locked loop based frequency multiplier and quadrature generator in accordance with some embodiments of the present invention. The frequency synthesizer 500 can be a fast locking wide range frequency synthesizer comprising a frequency multiplication mode selector unit 310, a primary synthesizer 320, a phase detector 510, a processing unit 520, a charge pump 530, a loop filter 540, an analog to digital converter (ADC) 550, a multiplexer 560, and a digital controlled delay line (DCDL) with frequency multiplier and quadrature generator (FMQG) 570. The DCDL with FMQG 570 includes a digital controlled delay line (DCDL) 590 and a frequency multiplier and quadrature generator (FMQG) core 595. The processing unit 520 of FIG. 5 receives a digital information signal 505 relating to a required primary frequency value of the signal 508 from the primary synthesizer 320 and also of the signals 593 from the DCDL 590 to the FMQG core 595 from the frequency multiplication mode selector unit 310. In accordance with some embodiments of the present invention, the FMQG core 595 also receives the digital information signal 308 relating to the frequency multiplication mode in which the frequency multiplier and quadrature generator core 595 should operate in order to generate the required final output signal from the frequency multiplier mode selector unit 310. The digital information signal 505 relating to the required primary frequency value and frequency multiplication mode of the frequency multiplier and quadrature generator core 595 is prior known information. In accordance with some embodiments of the present invention, the digital information signal 308 relating to the frequency multiplication mode of the FMQG core 595 is determined by the frequency multiplier mode selector unit 310.

The processing unit 520 of the frequency synthesizer 500 includes a look-up table 522 that is used to determine a pre-charge voltage value across the loop filter 540 that is further provided to the DCDL with FMQG 570 through the multiplexer 560. During the training mode, the primary frequency value of the input signal 508 of the phase detector 510 is varied according to various primary frequency values 505 and the voltage value across the loop filter 540 is measured at various primary frequency value of the input signal 508. This information regarding the voltage value 535 across the loop filter 540 with respect to the various primary frequency values 505 is analog in nature and is then converted from analog form to digital form using the ADC 550 and then stored in the look-up table 522.

In accordance with some embodiments of the present invention, during the normal mode of operation, when the processing unit 520 detects a change in the primary frequency value 505, the processing unit 520 provides a signal 525 to the multiplexer 560. The multiplexer 560 is a 2:1 multiplexer that receives two inputs namely the signal 525 from the processing unit 520 and the signal 558 from the ADC 550. In accordance with some embodiments of the present invention, when there is no change in the primary frequency value 505 of the input signal 508, the multiplexer 560 selects the signal 558 from the ADC 550 as its output 565 and provide the output 565 to the DCDL with FMQG 570. However, when the primary frequency value 505 of the input signal 508 changes (i.e. a frequency shift occurs), a select line 568 of the multiplexer is enabled due to which the multiplexer 560 selects the output 525 of the processing unit 520 at its output 565 and provide it to the DCDL with FMQG 570. In accordance with some embodiments of the present invention, the signal 525 from the processing unit 520 indicates a voltage value that should be provided to the DCDL with FMQG 570 in order to generate a required new primary frequency value at the DCDL with FMQG 570. The output 593 from the DCDL 590 is further provided to the FMQG core 595. The FMQG core 595 thus generates the output signals 575 and 578 having similar frequency as that of the required final output frequency value.

The phase detector 510 receives a primary frequency signal 508 and output 580 from the DCDL 590 as inputs. In accordance with some embodiments of the present invention, the output from the DCDL 590 will now be having frequency similar to that of the reference signal 508. The phase detector 510 compares the reference signal 508 with the output signal 580 from the DCDL 590. Based upon whether the reference signal 508 is leading or lagging the output from the DCDL 590, the phase detector sends either an up signal 515 or a down signal 518 to the charge pump 530 for charging or discharging the loop filter 540 respectively. In particular, the charge pump 530 upon receiving the up signal 515 sends a charge signal to charge the loop filter 540. Similarly, if the signal received by the charge pump 530 is a down signal 518, the charge pump sends a discharge signal to discharge the loop filter 540. This varies the voltage value 535 across the loop filter 540 and hence changes the voltage value of the signal 558 provided to the multiplexer 560 as input. The difference between the reference signal 508 and the output 580 of the DCDL with FMQG 570 is very small or almost negligible because of the signal 525 having voltage value close to the required signal frequency provided by the processing unit 520. Therefore, the time taken by the loop to settle down in this case is minimized. Thus, the loop will settle down faster in such cases thereby reducing the time taken by the FMQG core 595 to generate the outputs 575 and 578.

Figure 6:
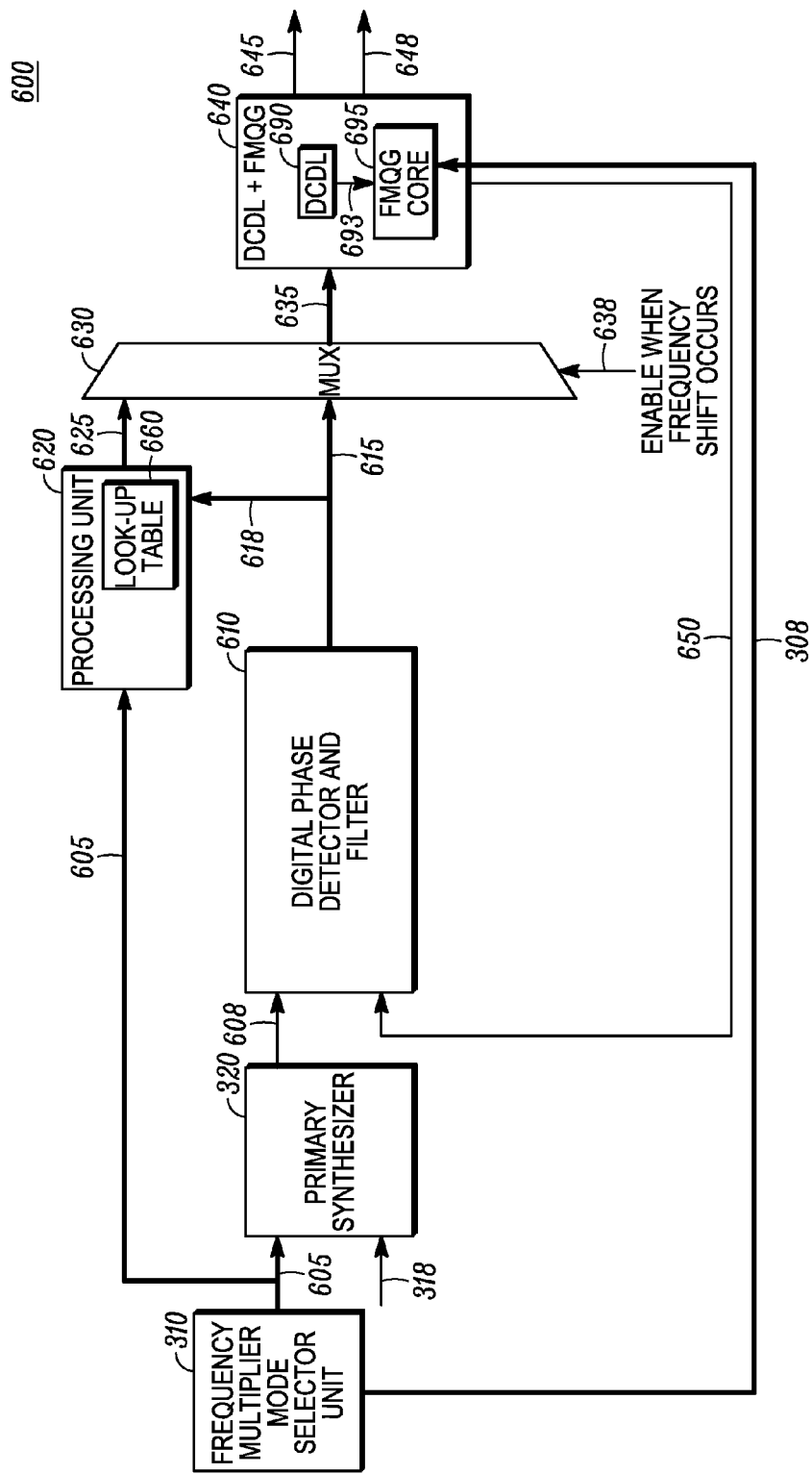
FIG. 6 shows a block diagram of a frequency synthesizer with a primary synthesizer and a delay locked loop based frequency multiplier and quadrature generator in accordance with some embodiments of the present invention.

FIG. 6 shows a block diagram of a frequency synthesizer with a primary synthesizer and a delay locked loop based frequency multiplier and quadrature generator in accordance with some embodiments of the present invention. The frequency synthesizer 600 can be a fast locking wide range frequency synthesizer comprising a primary synthesizer 320, a frequency multiplication mode selector unit 310, a digital phase detector and filter 610, a processing unit 620, a multiplexer 630, and a digital controlled delay line (DCDL) with a frequency multiplier and quadrature generator (FMQG) core 640. The DCDL with the FMQG 640 includes a digital controlled delay line (DCDL) 690 and a frequency multiplier and quadrature generator (FMQG) core 695. The processing unit 620 receives a digital information signal 605 relating to a required primary frequency value of the signal 608 from the primary synthesizer 320 and also of the signals 693 from the DCDL 690 to the FMQG core 695 from the frequency multiplier mode selector unit 310. In accordance with some embodiments of the present invention, the FMQG core 695 also receives the digital information signal 308 relating to the frequency multiplication mode in which the FMQG core 695 should operate in order to generate the required final output signal from the frequency multiplier mode selector unit 310. The digital information signal 605 relating to the required primary frequency value and frequency multiplication mode of the FMQG core 695 is prior known information. In accordance with some embodiments of the present invention, the digital information relating to the frequency multiplication mode of the FMQG core 695 is determined by the frequency multiplier mode selector unit 310.

The processing unit 620 of the frequency synthesizer 600 includes a look-up table 660 that is used to determine a pre-charge voltage value across the input 615 provided to the DCDL 690 through the multiplexer 630. During the training mode, the primary frequency value of the input signal 608 provided to the digital phase detector and filter 610 is varied according to the various primary frequency values 605 and the voltage value across the input 615 of the multiplexer 630 is measured at various primary frequency values 605. This information regarding the voltage value across the input 615 of the multiplexer 630 with respect to the various primary frequency values 605 is transmitted to the processing unit 620 through signal 618 and then stored in the look-up table 660.

In accordance with some embodiments of the present invention, during the normal mode of operation, when the processing unit 620 detects a change in the primary frequency value 605, the processing unit 620 provides a signal 625 to the multiplexer 630. The multiplexer 630 is a 2:1 multiplexer that receives two inputs namely the signal 625 from the processing unit 620 and the signal 615 from the digital phase detector and filter 610. In accordance with some embodiments of the present invention, when there is no change in the primary frequency value 605 of the input signal 608, the multiplexer 630 produces the signal 615 from the digital phase detector and filter 610 at its output 635 and provide the output 635 to the DCDL 690. However, when the primary frequency value of the input signal 608 changes (i.e. a frequency shift occurs), a select line 638 of the multiplexer 630 is enabled due to which the multiplexer 630 selects the output 625 of the processing unit 620 at its output 635 and provide it to the DCDL 690. In accordance with some embodiments of the present invention, the signal 625 from the processing unit 620 indicates a voltage value that should be provided to the DCDL 690 in order to generate a required new primary output frequency value at the DCDL 690. The output 693 from the DCDL 690 is further provided to the FMQG core 695. The FMQG core 695 thus generates the output signals 645 and 648 having similar frequency as that of the required final output frequency value.

The digital phase detector and filter 610 receives a primary frequency signal 608 and output 650 from the DCDL with FMQG 640 as inputs. In accordance with some embodiments of the present invention, the output 650 from the DCDL 690 will now be having frequency similar to that of the reference signal 608. The digital phase detector and filter 610 compares the reference signal 608 with the output signal 650 from the DCDL 690. Based upon whether the reference signal 608 is leading or lagging the output 650 from the DCDL 690, the digital phase detector and filter 610 varies the voltage across the input 615 that is provided to the multiplexer 630. The difference between the reference signal 608 and the output 650 of the DCDL 690 is very small or almost negligible because of the signal 625 having voltage value close to the required new primary. Therefore, the time taken by the loop to settle down in this case is minimized. Thus, the loop will settle down faster in such cases thereby reducing the time taken by the FMQG core 695 to generate the outputs 645 and 648.

Figure 7:
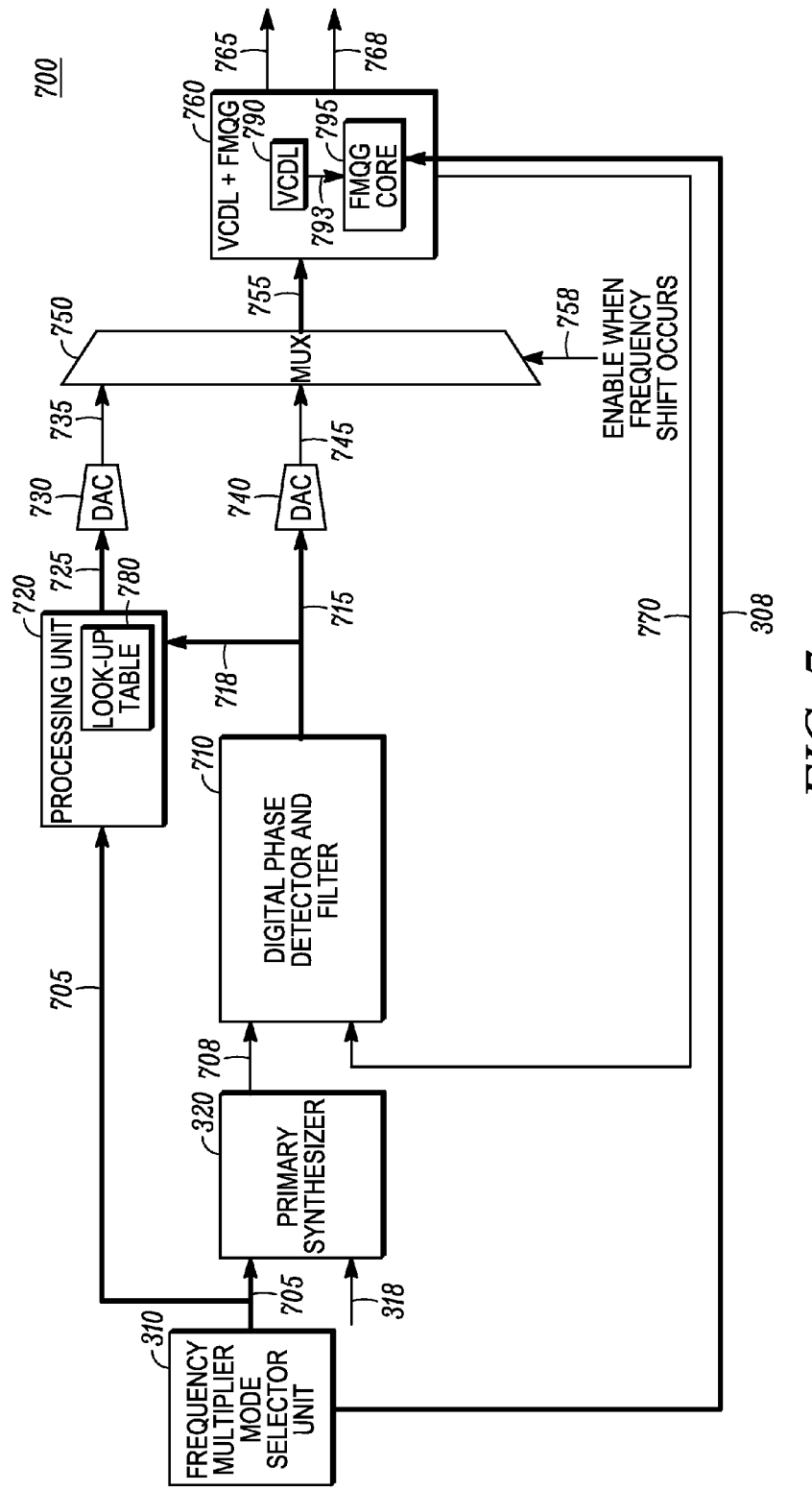
FIG. 7 shows a block diagram of a frequency synthesizer with a primary synthesizer and a delay locked loop based frequency multiplier and quadrature generator in accordance with some embodiments of the present invention.

FIG. 7 shows a block diagram of a frequency synthesizer with a primary synthesizer and a delay locked loop based frequency multiplier and quadrature generator in accordance with some embodiments of the present invention. The frequency synthesizer 700 can be a fast locking wide range frequency synthesizer comprising a primary synthesizer 320, a frequency multiplication mode selector unit 310, a digital phase detector and filter 710, a processing unit 720, a first digital to analog converter (DAC) 730, a second digital to analog converter (DAC) 740, a multiplexer 750, and a voltage controlled delay line (VCDL) with frequency multiplier and quadrature generator (FMQG) 760. The VCDL with FMQG 760 includes a voltage controlled delay line (VCDL) 790 and a frequency multiplier and quadrature generator (FMQG) core 795. The processing unit 720 receives a digital information signal 705 relating to a required primary frequency value of the signal 708 from the primary synthesizer 320 and also of the signals 793 from the VCDL 790 to the FMQG core 795 from the frequency multiplier mode selector unit 310. In accordance with some embodiments of the present invention, the FMQG core 795 also receives the digital information signal 308 relating to the frequency multiplication mode in which the FMQG core 795 should operate in order to generate the required final output signal from the frequency multiplier mode selector unit 310. The digital information 705 relating to the required primary frequency value and frequency multiplication mode of the FMQG core 795 is prior known information. In accordance with some embodiments of the present invention, the digital information relating to the frequency multiplication mode of the FMQG core 795 is determined by the frequency multiplier mode selector unit 310.

The processing unit 720 of the frequency synthesizer 700 includes a look-up table 780 that is used to determine a pre-charge voltage value across the input 725 provided to the VCDL with FMQG 760 through the multiplexer 750. During the training mode, the primary frequency value of the input signal 708 provided to the digital phase detector and filter 710 is varied according to the various primary frequency values 705 and the output 715 of the digital phase detector and filter 710 is measured at various primary frequency values 705. This information regarding the digital phase detector and filter output values 715 with respect to the various primary frequency values 705 is transmitted to the processing unit 720 through signal 718 and then stored in the look-up table 780.

In accordance with some embodiments of the present invention, during the normal mode of operation, when the processing unit 720 detects a change in the primary frequency value 705, the processing unit 720 provides a signal 725 to the multiplexer 750. In accordance with some embodiments of the present invention, the signal 725 is digital in nature so it is first converted to analog form by the first DAC 730 and then provided as signal 735 to the multiplexer 750. The multiplexer 750 is a 2:1 multiplexer that receives two inputs namely the signal 735 from the processing unit 720 and the signal 745 from the digital phase detector and filter 710. The signal 745 is the output 715 of the digital phase detector and filter 710 that is converted into analog form by the second DAC 740. In accordance with some embodiments of the present invention, when there is no change in the primary frequency value 705 of the input signal 708, the multiplexer 750 selects the signal 745 from the digital phase detector and filter 710 as its output 755 and provide the output 755 to the VCDL 790. However, when the primary frequency value of the input signal 708 changes (i.e. a frequency shift occurs), a select line 758 of the multiplexer 750 is enabled due to which the multiplexer 750 selects the output 745 of the processing unit 720 at its output 755 and provide it to the VCDL 790. In accordance with some embodiments of the present invention, the signal 735 from the processing unit 720 indicates a voltage value that should be provided to the VCDL 790 in order to generate a required new primary output frequency value at the VCDL 790. The FMQG core 795 thus generates the output signals 765 and 768 having similar frequency as that of the required final output frequency value.

The digital phase detector and filter 710 receives a primary frequency signal 708 and output 770 from the VCDL 790 as inputs. In accordance with some embodiments of the present invention, the output 770 from the VCDL 790 will now be having frequency similar to that of the reference signal 708. The digital phase detector and filter 710 compares the reference signal 708 with the output signal 770 from the VCDL 790. Based upon whether the reference signal 708 is leading or lagging the output 770 from the VCDL with FMQG 760, the digital phase detector and filter 710 varies the voltage across the input 715 that is provided to the multiplexer 750 after being converted to analog form by the second DAC 740. The difference between the reference signal 708 and the output 770 of the VCDL 790 is very small or almost negligible because of the signal 755 having value close to the that for the required new primary frequency provided by the processing unit 720. Therefore, the time taken by the loop to settle down in this case is minimized. Thus, the loop will settle down faster in such cases thereby reducing the time taken by the FMQG core 795 to generate the outputs 765 and 768.

Figure 8A:
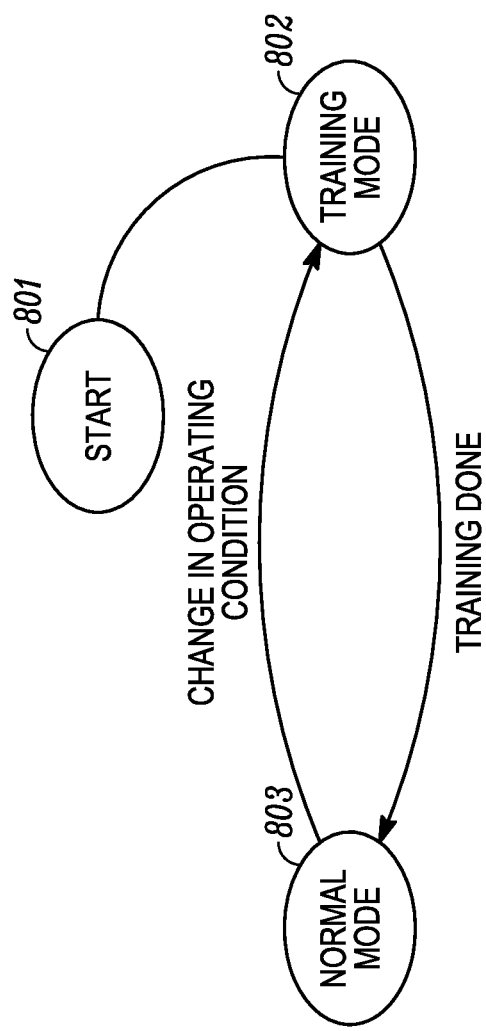
FIG. 8A is a state diagram of two modes of operation: training and normal of the frequency synthesizer with the primary synthesizer and the delay locked loop based frequency multiplier and quadrature generator in accordance with some embodiments of the present invention.

FIG. 8A is a state diagram of two modes of operation: training and normal of the frequency synthesizer in accordance with some embodiments of the present invention. The state diagram starts at 801 and moves to a training mode 802 where the processing unit measures the voltage values across the loop filter corresponding to various primary frequency values. After the training mode, the next state is a normal mode 803 where for every change in the primary frequency value the DLL is pre-charged by the processing unit to a required voltage value determined during the training mode 802. The operation from the normal mode 803 changes to the training mode 802 in response to change in the operating conditions. In accordance with some embodiments of the present invention, the operating conditions include but are not limited to user input, environmental changes (for example, temperature change), and periodic updates.

Figure 8B:
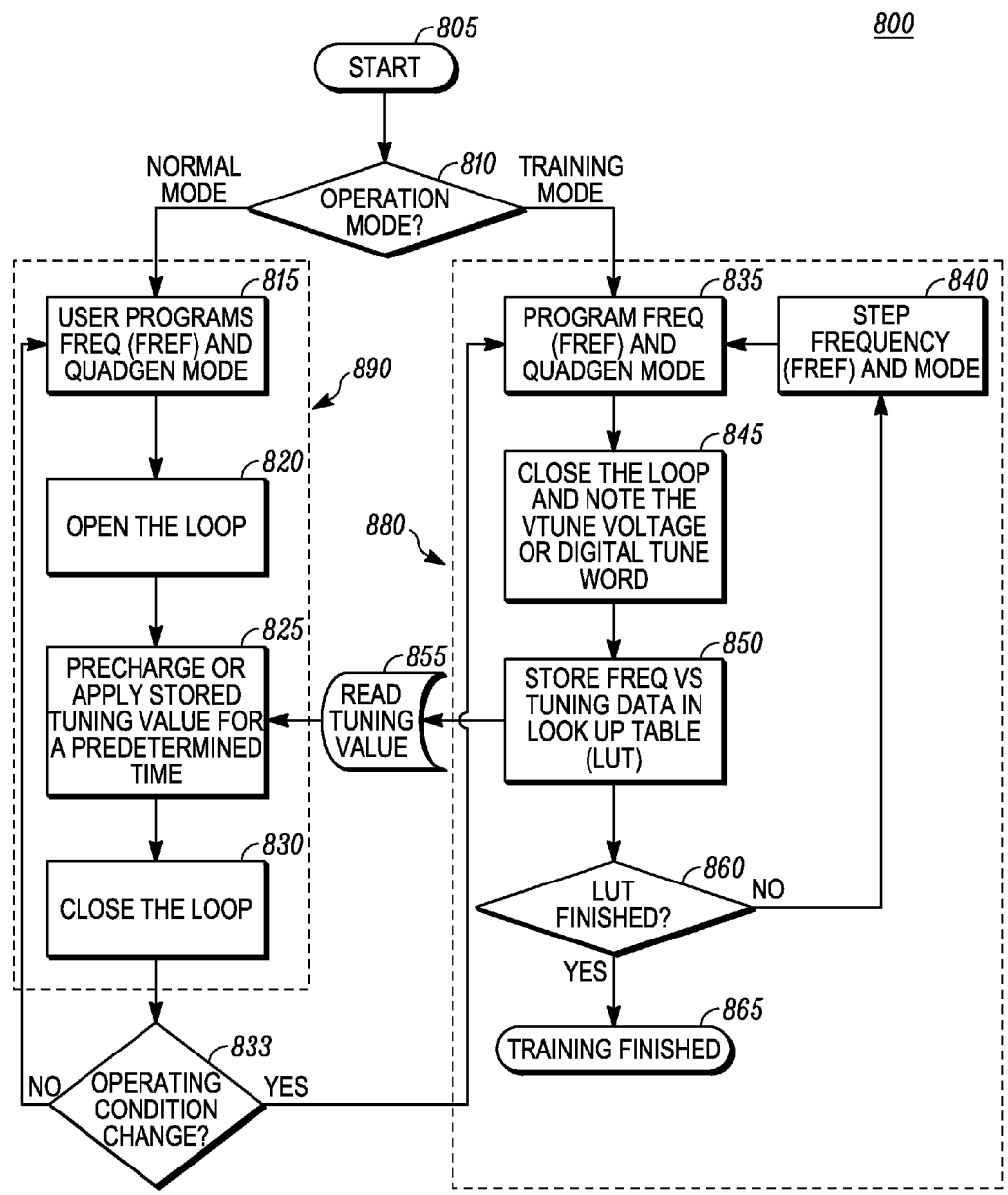
FIG. 8B is a flowchart of a method for fast frequency locking in the frequency synthesizer with the primary synthesizer and the delay locked loop based frequency multiplier and quadrature generator in accordance with some embodiments of the present invention.

FIG. 8B is a flowchart of a method 800 for fast frequency locking in the frequency synthesizer in accordance with some embodiments of the present invention. The method starts with 805. At 810, the operation mode of the frequency synthesizer is determined. In accordance with some embodiments of the present invention, the frequency synthesizer can be operated in two modes namely a normal mode or a training mode. If the operating mode of the frequency synthesizer is normal mode, then the frequency synthesizer will operate in the normal mode represented by block 890. The method in the normal mode 890 starts with 815, where a program frequency and a quadrature generation mode is determined. In accordance with some embodiments of the present invention, the program frequency is a primary frequency value and the quadrature generation mode is a frequency multiplication mode in which the frequency multiplier and quadrature generator should operate in order to get the required output final frequency.

The method further proceeds to 820, where upon determining the program frequency and the quadrature generation mode, a delay locked loop in the frequency synthesizer is opened. At 825, a pre-charge voltage value is applied to the delay locked loop. In accordance with some embodiments of the present invention, the pre-charge voltage value is determined by a processing unit in the frequency synthesizer. At 830, the delay locked loop is closed after pre-charging the delay locked loop. The method further proceeds to 833, where it is determined whether the operating conditions are same or are changed. If the operating conditions are same, the method goes back to 815. Otherwise, the method proceeds to a training mode 880 explained below.

In case the determined operating mode is a training mode 880, then the method proceeds to 835 where a primary frequency value signal and a frequency multiplication mode is applied to the frequency synthesizer. After applying the particular frequency signal and the frequency multiplication mode, a delay locked loop in the frequency synthesizer is closed at 845. Further, at 845, after the delay locked loop is closed, a voltage value across the delay locked loop is noted. In accordance with some embodiments of the present invention, the voltage value can be digital or analog in nature. The method further proceeds to 850 where the determined voltage value corresponding to the particular frequency signal is stored in a look-up table in a processing unit. In accordance with some embodiments of the present invention, this stored voltage value is provided to the DLL while operating in the normal mode to pre-charge a loop filter in the delay locked loop. At 860, it is determined if the value of the particular frequency signal is changed or not. If the frequency signal is changed (i.e. a frequency shift has occurred), then the method proceeds to 840, where the new frequency signal and the frequency multiplication mode is determined and the method 835-860 is repeated. In case, there is no frequency change, in that case, the training mode is finished at 865 and the look-up table is stored in the processing unit.

Figure 10:
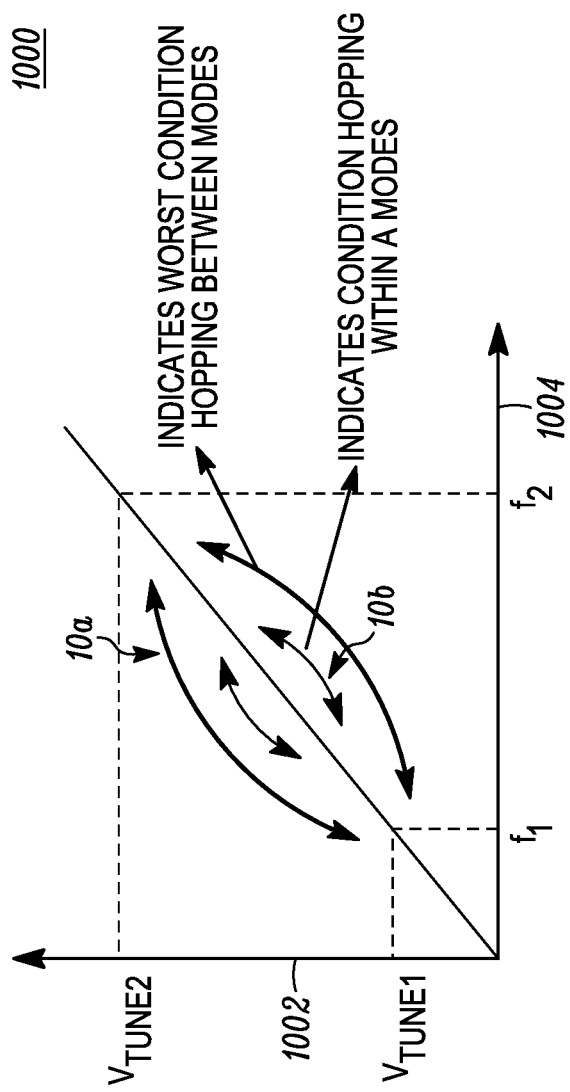
FIG. 10 is a graph showing frequency hopping within and across the frequency multiplier modes in accordance with some embodiments of the present invention.

In accordance with some embodiments of the present invention, the frequency multiplier and quadrature generator is operated in multiple frequency multiplication modes to achieve wide range of frequency. For example, the frequency multiplier and quadrature generator can be operated in frequency multiplication modes 1×, 2×, and 4× to achieve an overall frequency range of 500 MHz to 4 GHz while the input is maintained between 500 MHz to 1 GHz. The settling time is not a huge issue when the input required final frequency is switched within a frequency multiplication mode of operation. For example if the input frequency is switched from 700 MHz to 750 MHz then, the primary frequency changes from 700 MHz to 750 MHz. The frequency multiplier and quadrature generator is operated in 1× mode. Then as shown in the example of a look-up table in FIG. 9 the tuning change required in the DLL is small and the settling time associated with it is small as well. But in cases where fast switching is required around the extremes ends of the DLL tuning, say around 2 GHz then the Frequency Multiplier and Quadrature Generator needs to be operated in different frequency multiplication modes, namely 1× and 2×, which then exacerbates the settling time issue. FIG. 10 is a graph 1000 of tuning voltage shown along axis 1002 vs frequency shown along axis 1004 in accordance with some embodiments of the present invention. FIG. 10 shows a curve 10a indicating a worst condition hopping between the two extreme values between modes of tuning voltages in the DLL. Similarly, the curve 10b shows indicates condition hoping between the two values within a mode in the DLL.

Figure 11:
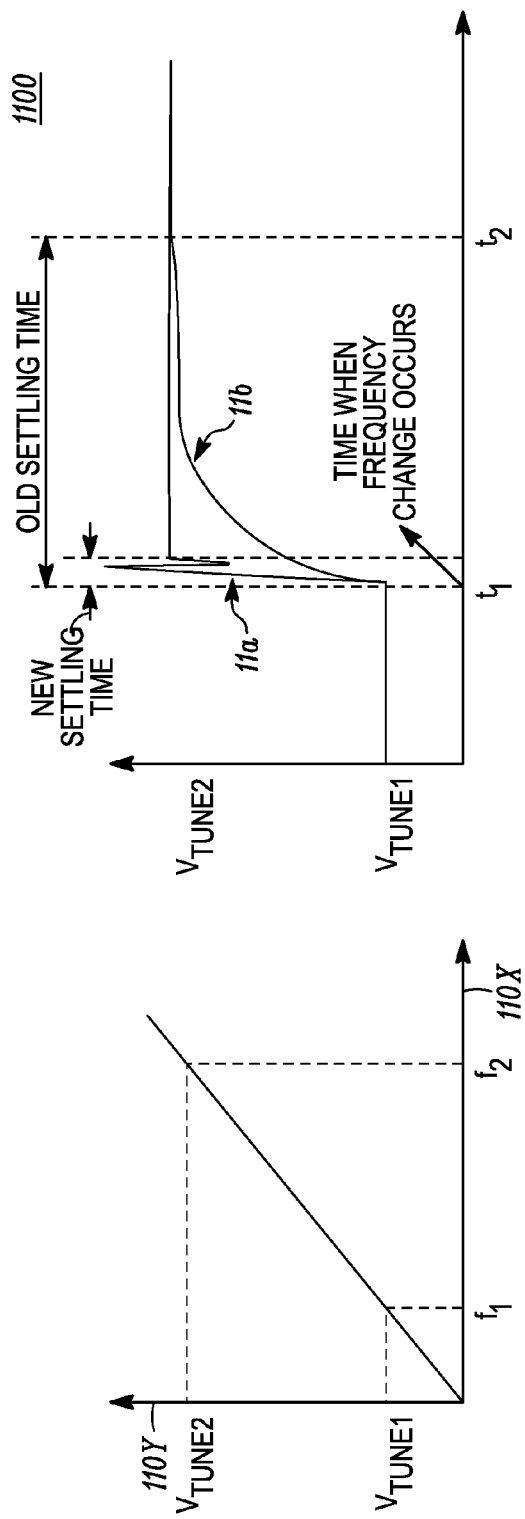
FIG. 11 shows a graph showing the tuning characteristics of a delay locked loop in accordance with some embodiments of the present invention.

FIG. 11 is a graph 1100 of a simple linear tuning characteristic of a delay locked loop in accordance with some embodiments of the present invention. In FIG. 11, a graph is shown between the voltage represented by 110 Y axis vs frequency represented by 110 X axis. In FIG. 11, for frequency f1 the tuning voltage is Vtune1 and similarly for frequency f2 the tuning voltage at lock is at Vtune2. In FIG. 11, with a sudden change in frequency from f1 to f2, the conventional DLL will follow the pattern 11b before settling down to the new frequency and tuning voltage. In this case, the time associated with this settling is a function of the new frequency. However, in accordance with the embodiments of the present invention, the faster settling time to the new frequency and tuning voltage can be achieved faster as shown in the curve 11a. This new settling time can be made almost independent of the frequency of operation or any non-idealities in the loop with the use of the present invention.

Figure 12:
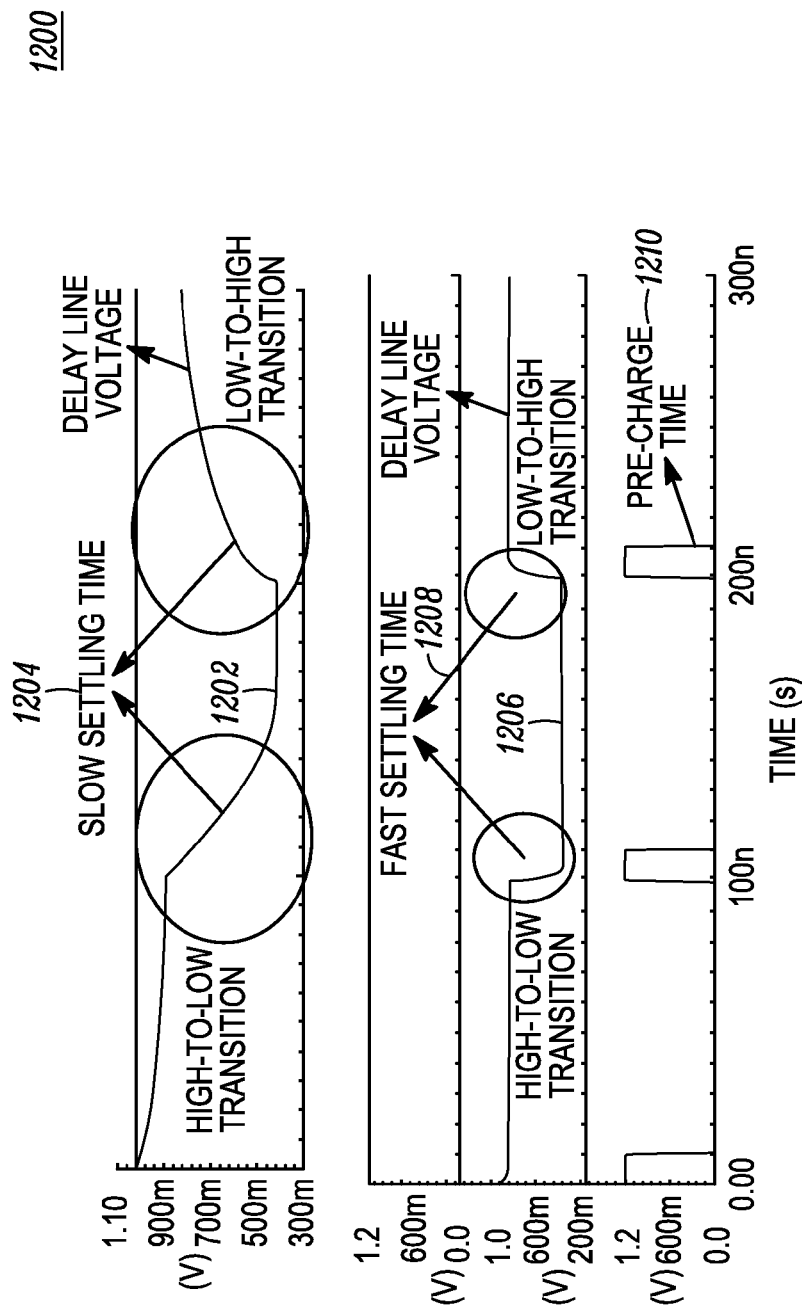
FIG. 12 shows the results of a simple frequency transition in the frequency synthesizer in accordance with some embodiments of the present invention.

FIG. 12 shows an example of results of a simple frequency transition in the Frequency Multiplier and Quadrature Generator in accordance with some embodiments of the present invention. The upper curve 1202 in FIG. 12 captures a high-to-low and low-to-high transition of the primary frequency value. As shown in FIG. 12, the time 1204 to settle for each transition is large and varies depending on the amount of change and the direction of change due to the DLL mechanism. The large settling time associated with the frequency multiplier and quadrature generator limits the rate of change of frequency, and hinders any kind of fast switching of the local oscillator signal in a transceiver. The lower curve 1206 in the FIG. 12 shows an example of results obtained with the Frequency Multiplier and Quadrature Generator operating in accordance with the various embodiments of the present invention. As can be seen the settling time 1208 associated with the transitions is drastically reduced thus enabling faster switching between frequencies.

The method and apparatus for fast frequency locking in the closed loop based frequency synthesizer described above in accordance with the embodiments of the present invention can be used in the scenarios where the input signal can vary rapidly over the wide frequency range such as fast spectral sensing or direct digital modulation.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, or article that comprises, has, includes, contains a list of elements does not include only those elements but may include other elements not expressly listed or inherent to such process, method, or article. An element proceeded by "comprises . . . a", "has . . . a", "includes . . . a", "contains . . . a" does not, without more constraints, preclude the existence of additional identical elements in the process, method, or article that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:
1. A method for fast locking of a wide-range frequency synthesizer comprising:
receiving, by a first processing unit, a digital information signal relating to a required final frequency signal;
determining, by the first processing unit, a primary frequency value and a corresponding frequency multiplication mode based upon the digital information signal;
receiving, by a primary synthesizer, the primary frequency value and an external reference frequency signal;
generating, by the primary synthesizer, a signal of the primary frequency value based upon the received primary frequency value and the external reference frequency signal;
receiving, by a second processing unit, the primary frequency value;
determining, by the second processing unit, a pre-charge voltage value corresponding to the primary frequency value, wherein the pre-charge voltage value is voltage value across a loop filter of a delay locked loop measured by the second processing unit during a training mode;
receiving, by the delay locked loop, the signal of the primary frequency value;
transmitting, by the second processing unit, in response to a change in the primary frequency value, a signal to open the delay locked loop and the pre-charge voltage value measured during the training mode corresponding to a new value of the primary frequency signal;
pre-charging the delay locked loop to the pre-charge voltage value for a predetermined time in response to opening the delay locked loop; and
closing the delay locked loop in response to pre-charging the delay locked loop to obtain fast locking of the wide-range frequency synthesizer.

2. The method of claim 1, wherein the primary synthesizer is a phase locked loop or a direct digital synthesizer.

3. The method of claim 1, wherein the first processing unit, the primary synthesizer, the second processing unit, and the delay locked loop are integrated within the wide-range frequency synthesizer.

4. The method of claim 1, wherein the primary frequency value indicates frequency of a signal to provide to the delay locked loop in order to obtain the required final frequency signal from a frequency multiplier and quadrature generator of the wide-range frequency synthesizer as an output, and the determined frequency multiplication mode indicates a mode in which the frequency multiplier and quadrature generator operates in order to generate the required final frequency signal.

5. The method of claim 4, further comprising:
generating, by the delay locked loop, multiple copies of the signal of the primary frequency value of various phases upon receiving the signal of the primary frequency value.

6. The method of claim 5, further comprising:
transmitting, by the delay locked loop, the generated multiple copies of the signal of the primary frequency value of various phases to the frequency multiplier and quadrature generator.

7. The method of claim 6, further comprising:
generating, by the frequency multiplier and quadrature generator, an in-phase (I) and a quadrature phase (Q) signals of the required final frequency signal.

8. The method of claim 1, wherein second processing unit includes a look-up table that stores pre-charge values corresponding to various primary frequency values.

9. The method of claim 8, wherein the look-up table is prepared in a factory or in a field by varying input primary frequency of the delay locked loop and capturing the pre-charge values corresponding to various input frequencies.

10. The method of claim 8, wherein the look-up table is updateable.

11. The method of claim 8, wherein closing the delay locked loop in response to the pre-charging enables a charge pump to charge or discharge a loop filter in the DLL based on the pre-charge voltage value.

12. A fast locking wide-range frequency synthesizer comprising:
- a first processing unit for receiving a digital information signal relating to a required final frequency signal and determining a primary frequency value and a corresponding frequency multiplication mode based upon the digital information;
- a primary synthesizer for receiving the primary frequency value and an external reference frequency signal and generating a signal of the primary frequency based upon the received primary frequency value and the external reference frequency signal;
- a second processing unit for receiving the primary frequency value, determining a pre-charge voltage value corresponding to the primary frequency value wherein the pre-charge voltage value is a voltage value across a loop filter in a delay locked loop measured during a training mode, and transmitting a signal to open the delay locked loop and the pre-charge voltage value to the delay locked loop in response to a change in the primary frequency value; and
- the delay locked loop for receiving the signal of primary frequency value and the pre-charge value, pre-charging the delay locked loop to the pre-charge voltage value for a predetermined time by opening the delay locked loop, and closing the delay locked loop in response to pre-charging the delay locked loop to obtain fast locking of the fast locking wide-range frequency synthesizer.

13. The synthesizer of claim 12, wherein the primary synthesizer is a phase locked loop or a direct digital synthesizer.

14. The synthesizer of claim 12, wherein the primary frequency value indicates frequency of a signal to be provided to the delay locked loop in order to obtain the required final frequency signal from a frequency multiplier and quadrature generator of the fast locking wide-range frequency synthesizer as an output, and the determined frequency multiplication mode indicates a mode in which the frequency multiplier and quadrature generator of the wide range frequency synthesizer operates in order to generate the required final frequency signal.

15. The synthesizer of claim 14, further comprising:
- the delay locked loop for generating the multiple copies of the signal of the primary frequency value of various phases upon receiving the signal of the primary frequency value.

16. The synthesizer of claim 15, further comprising:
- the delay locked loop for transmitting the generated multiple copies of the signal of the primary frequency value of various phases to the frequency multiplier and quadrature generator.

17. The synthesizer of claim 16, further comprising:
- the frequency extension and quadrature generator for generating the in-phase (I) and a quadrature phase (Q) signals of the required final frequency signal.

18. The synthesizer of claim 12, wherein second processing unit includes a look-up table that stores pre-charge values corresponding to various primary frequency values.

19. The synthesizer of claim 18, wherein the look-up table is prepared in a factory or in a field by varying input frequency of the delay locked loop and capturing the pre-charge voltage corresponding to various input frequencies.

20. The synthesizer of claim 18, wherein the look-up table is updateable.

* * * * *